(12) United States Patent
Maevskii et al.

(10) Patent No.: US 10,879,937 B2
(45) Date of Patent: Dec. 29, 2020

(54) GEL CODEWORD STRUCTURE ENCODING AND DECODING METHOD, APPARATUS, AND RELATED DEVICE

(71) Applicant: Huawei Technologies Co., Ltd., Guangdong (CN)

(72) Inventors: Aleksei Eduardovich Maevskii, Moscow (RU); Vladimir Gritsenko, Moscow (RU); Shiyao Xiao, Chengdu (CN); Hong Chen, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/169,212

(22) Filed: Oct. 24, 2018

(65) Prior Publication Data

US 2019/0089381 A1 Mar. 21, 2019

Related U.S. Application Data

(63) Continuation of application No. PCT/CN2016/102742, filed on Oct. 20, 2016.

(30) Foreign Application Priority Data

Apr. 25, 2016 (CN) .......................... 2016 1 0259824

(51) Int. Cl.
*H03M 13/29* (2006.01)
*H03M 13/15* (2006.01)
(Continued)

(52) U.S. Cl.
CPC ....... *H03M 13/2906* (2013.01); *H03M 13/03* (2013.01); *H03M 13/033* (2013.01);
(Continued)

(58) Field of Classification Search
CPC ............. H03M 13/2906; H03M 13/03; H03M 13/2927; H03M 13/033; H03M 13/1525;
(Continued)

(56) References Cited

U.S. PATENT DOCUMENTS 9,047,203 B1 6/2015 Rumbolt
2008/0168329 A1* 7/2008 Han .................... G06F 11/1012
714/764

(Continued)

FOREIGN PATENT DOCUMENTS

CN 102710943 A 10/2012
CN 103763736 A 4/2014
(Continued)

OTHER PUBLICATIONS

A. Fahrner, "Burst erasure correcting generalized error-locating codes," International Zurich Seminar on Communications, 2004, Zurich, Switzerland, 2004, pp. 64-67. (Year: 2004).*
(Continued)

*Primary Examiner* — Cynthia Britt
(74) *Attorney, Agent, or Firm* — Womble Bond Dickinson (US) LLP

(57) ABSTRACT

An $H_C$ of a code B is first transformed into an $H^B$. A parity bit of the code B is obtained by performing an operation on the $H^B$ and an information bit of the code B. The parity bit is used to perform RS coding on a code A, to obtain a parity bit of the code A. A check code of a GEL code is obtained by performing an operation on the parity bits of the code B and the code A. Finally, a single bit parity check bit is added. The code A is defined in a finite field GF $(2^{l_1})$, the code B is defined in a finite field GF $(2^{l_2})$, and $l_1$ and $l_2$ are positive integers. A success rate of decoding the code A in the first row can be improved using this method.

17 Claims, 6 Drawing Sheets

(51) Int. Cl.
*H03M 13/03* (2006.01)
*H03M 13/00* (2006.01)
*H03M 13/09* (2006.01)

(52) U.S. Cl.
CPC ... *H03M 13/1515* (2013.01); *H03M 13/1525* (2013.01); *H03M 13/1545* (2013.01); *H03M 13/2927* (2013.01); *H03M 13/616* (2013.01); *H03M 13/098* (2013.01); *H03M 13/2942* (2013.01)

(58) Field of Classification Search
CPC .......... H03M 13/1545; H03M 13/616; H03M 13/1515; H03M 13/098; H03M 13/2942
See application file for complete search history.

(56) References Cited

U.S. PATENT DOCUMENTS

| | | |
|---|---|---|
| 2013/0132796 A1 | 5/2013 | Vummintala et al. |
| 2013/0216221 A1 | 8/2013 | Zhang et al. |
| 2015/0160991 A1 | 6/2015 | Stojanovic et al. |
| 2015/0207524 A1 | 7/2015 | Vojcic et al. |
| 2015/0280745 A1 | 10/2015 | Cho |

FOREIGN PATENT DOCUMENTS

| | | |
|---|---|---|
| CN | 104205647 A | 12/2014 |
| CN | 104883194 A | 9/2015 |
| CN | 105122654 A | 12/2015 |
| WO | 03058865 A1 | 7/2003 |
| WO | 2016028452 A1 | 2/2016 |

OTHER PUBLICATIONS

A. Fahrner, H. Griesser, R. Klarer and V. V. Zyablov, "Low-complexity GEL codes for digital magnetic storage systems," in IEEE Transactions on Magnetics, vol. 40, No. 4, pp. 3093-3095, Jul. 2004. (Year: 2004).*

I. Zhilin, F. Ivanov and V. Zyablov, "Generalized Error Locating Codes with Soft Decoding of Inner Codes," Proceedings of European Wireless 2015; 21th European Wireless Conference, Budapest, Hungary, 2015, pp. 1-5. (Year: 2015).*

Igor Zhilin et al., "Generalized error locating codes with soft decoding of inner codes", Proceedings of 21st European Wireless Conference, May 20, 2015, pp. 178-182, XP055542620.

Griesser H. et al., "On the decoding of generalized error-locating codes", ITG-Fachberichte, vol. 159, Jan. 1, 2000, pp. 209-214, XP009191138.

I. V. Zhilin et al., "Generalized Error-Locating Codes and Minimization of Redundancy for Specified Input and Output Error Probabilities", Journal of Communications Technology and Electronics, vol. 60, No. 6, Jul. 12, 2015, pp. 695-706, XP035511800.

Johannes Maucher et al., "On the Equivalence of Generalized Concatenated Codes and Generalized Error Location Codes", IEEE Transactions on Information Theory, vol. 46, No. 2, Mar. 1, 2000, 8 pages, XP011027591.

H. Zhang et al., "16QAM transmission with bits/s/Hz spectral efficiency over transoceanic distance", Optics Express, vol. 20, No. 11, May 21, 2012, pp. 11688-11693, XP055110608.

* cited by examiner

GEL CODEWORD STRUCTURE ENCODING AND DECODING METHOD, APPARATUS, AND RELATED DEVICE

CROSS-REFERENCE TO RELATED APPLICATIONS

This application is a continuation of International Application No. PCT/CN2016/102742, filed on Oct. 20, 2016, which claims priority to Chinese Patent Application No. 201610259824.X, filed on Apr. 25, 2016. The disclosures of the aforementioned applications are hereby incorporated by reference in their entireties.

TECHNICAL FIELD

This application relates to the field of communication coding, and in particular, to a generalized error-locating (GEL) codeword structure encoding and decoding method, an apparatus, and a related device.

BACKGROUND

With the robust growth of data center construction, corresponding data traffic increases rapidly. This has a positive effect on a communications network, especially on an optical network market, and injects new lives into an optical network device market. With the continuous growth of the data center construction, data center interconnect becomes a fastest-growing application in optical network devices, but new requirements are also imposed on the data center interconnect. Emerging requirements on metropolitan hyperscale data center interconnect include smaller sizes and lower power consumption in terms of cost-per-bit.

In an existing GEL codeword structure, a row code A and a column code B are defined in GF ($q_A$) and GF ($q_B$), where GF is short for Galois Field, and is also referred to as a finite field, GF ($q_A$) represents a finite field including $q_A$ elements, and GF ($q_B$) represents a finite field including $q_B$ elements. The row code A and the column code B meet the following constraint:

$q_A=2^{l1}, q_B=2^{l2}, l1|l2$, where $l_1$ and $l_2$ are both integers, $l_1$ and $l_2$ represent bit widths represented by using binary forms of elements in GF ($2^{l1}$) and GF ($2^{l2}$) respectively, and $l_1$ can be exactly divided by $l_2$. Because a syndrome required by the code B for performing decoding is an error value of the code A, a bit width of the error value of the code A needs to be an integer multiple of a bit width of the syndrome of the code B. In the existing GEL codeword structure, an exact division constraint is required in a GF at which a row code and a column code are located. Consequently, codeword construction is inflexible, complexity of implementation is high, and codeword overheads are relatively high.

SUMMARY

Embodiments of this application provide a GEL codeword structure encoding and decoding method, an apparatus, and a related device, so as to reduce complexity of decoding, and reduce codeword overheads.

A first aspect of this application provides a GEL codeword structure encoding method, including:

first obtaining a target check matrix $H^B$ by performing elementary transformation on an original check matrix $H_C$ of a code B; obtaining a parity bit of the code B by performing a first operation on the $H^B$ and an information bit of the code B; using the parity bit of the code B as an information bit of a code A to perform Reed-Solomon RS coding on the code A, to obtain a parity bit of the code A; then obtaining a check code of a GEL code by performing a second operation on the parity bit of the code B and the parity bit of the code A; and finally adding a single bit parity check SPC parity bit, where the SPC parity bit is used to check an error location in codes A at a first layer during decoding, where the code A is a row code, the code B is a column code, the code A is defined in a finite field GF ($2^{l1}$), the code B is defined in a finite field GF ($2^{l2}$), and $l_1$ and $l_2$ are positive integers.

In a GEL codeword structure, in a decoding process, decoding is started from the first layer, and decoding from a second layer to a last layer is performed sequentially. Each layer needs to obtain prior information from an upper layer during decoding, and then decoding is performed according to the prior information. However, the first layer cannot obtain prior information. Therefore, decoding can be performed only according to check codes of a row code and a column code. Because of a capability of decoding the check codes of the row code and the column code, decoding at the first layer may fail. However, in this embodiment of this application, when GEL coding is performed, the SPC parity bit is added, where the SPC parity bit is used to check the error location in the codes A (that is, row codes) at the first layer during decoding. In this way, the SPC parity bit can be used as prior information of a code A in a first row, so that the code A in the first row can be decoded according to the SPC, and a success rate of decoding the code A in the first row is improved, thereby improving efficiency of an entire decoding process.

In addition, in this embodiment of this application, the code A is defined in the finite field GF ($2^{l1}$), the code B is defined in the finite field GF ($2^{l2}$), and $l_1$ and $l_2$ are positive integers. In this way, an exact division constraint does not exist between $l_1$ and $l_2$. Therefore, in a GEL codeword structure design process, $l_2$ may be reduced as much as possible, that is, a bit width of a code B symbol is reduced, and complexity of decoding the code B is reduced, so that codeword overheads are reduced, and performance of the GEL code is effectively improved. This meets requirements of the system for low power consumption of products, and also improves performance of a communications transmission system.

A second aspect of this application provides a GEL codeword structure decoding method, including: first determining prior information of a code A at each layer, where the prior information of the code A at each layer is a location of an error occurring when a code B is decoded at an upper layer, prior information of a code A at a first layer is an SPC parity bit, and the SPC parity bit is a parity bit added when a sending device performs GEL coding; recovering the code A at each layer by using a check matrix $H^B$ that is of the code B and that is the same as that of the sending device; decoding the recovered code A at each layer, to obtain an erroneous code B and a syndrome of the code B; and then decoding the erroneous code B by using the syndrome of the code B, and correcting the erroneous code B, where the code A is a row code, the code B is a column code, the code A is defined in a finite field GF ($2^{l1}$), the code B is defined in a finite field GF ($2^{l2}$), and $l_1$ and $l_2$ are positive integers.

When GEL coding is performed, the SPC parity bit is added, where the SPC parity bit is used to check the error location in the codes A (that is, row codes) at the first layer during decoding. In this way, the SPC parity bit can be used as prior information of a code A in a first row, so that the code A in the first row can be decoded according to the SPC, and a success rate of decoding the code A in the first row is improved, thereby improving efficiency of an entire decoding process.

A third aspect of this application provides a sending device, and the sending device has a function of implementing the method indicated in the first aspect. The function may be implemented by using hardware, or may be implemented by hardware by executing corresponding software. The hardware or the software includes one or more modules corresponding to the foregoing function.

The sending device provided in the third aspect of this application includes:

a transformation unit, configured to obtain a target check matrix $H^B$ by performing elementary transformation on an original check matrix $H_C$ of a code B;

an operation unit, configured to obtain a parity bit of the code B by performing a first operation on the target check matrix $H^B$ and an information bit of the code B;

an encoding unit, configured to use the parity bit of the code B as an information bit of a code A to perform Reed-Solomon RS coding on the code A, where the operation unit is further configured to obtain a check code of a GEL code by performing a second operation on the parity bit of the code B and a result obtained after RS coding is performed on the code A; and an adding unit, configured to add a single bit parity check SPC parity bit, where the SPC parity bit is used to check an error location in codes A at a first layer during decoding, where the code A is a row code, the code B is a column code, the code A is defined in a finite field GF ($2^{l_1}$), the code B is defined in a finite field GF ($2^{l_2}$), and $l_1$ and $l_2$ are positive integers.

A fourth aspect of this application provides a receiving device, and the receiving device has a function of implementing the method indicated in the second aspect. The function may be implemented by using hardware, or may be implemented by hardware by executing corresponding software. The hardware or the software includes one or more modules corresponding to the foregoing function.

The receiving device provided in the fourth aspect of this application includes:

a determining unit, configured to determine prior information of a code A at each layer, where the prior information of the code A at each layer is a location of an error occurring when a code B is decoded at an upper layer, prior information of a code A at a first layer is an SPC parity bit, and the SPC parity bit is a parity bit added when a sending device performs GEL coding;

a recovery unit, configured to recover the code A at each layer by using a check matrix $H^B$ that is of the code B and that is the same as that of the sending device;

a decoding unit, configured to decode the recovered code A at each layer, to obtain an erroneous code B and a syndrome of the code B; and a correction unit, configured to: decode the erroneous code B by using the syndrome of the code B, and correct the erroneous code B, where the code A is a row code, the code B is a column code, the code A is defined in a finite field GF ($2^{l_1}$), the code B is defined in a finite field GF ($2^{l_2}$), and $l_1$ and $l_2$ are positive integers.

A fifth aspect of this application provides a sending device, and the sending device has a function of implementing the method indicated in the first aspect. The function may be implemented by using hardware, or may be implemented by hardware by executing corresponding software. The hardware or the software includes one or more modules corresponding to the foregoing function.

The sending device provided in the fifth aspect of this application includes:

a memory, a processor, and a transceiver, where the memory, the processor, and the transceiver are interconnected by using a bus, the memory stores a computer instruction, and the processor implements the GEL codeword structure encoding method according to the first aspect by executing the computer instruction.

A sixth aspect of this application provides a receiving device, and the receiving device has a function of implementing the method indicated in the second aspect. The function may be implemented by using hardware, or may be implemented by hardware by executing corresponding software. The hardware or the software includes one or more modules corresponding to the foregoing function.

The receiving device provided in the sixth aspect of this application includes:

a memory, a processor, and a transceiver, where the memory, the processor, and the transceiver are interconnected by using a bus, the memory stores a computer instruction, and the processor implements the GEL codeword structure decoding method according to the second aspect by executing the computer instruction.

A seventh aspect of this application provides a storage medium, configured to store a computer software instruction used by the foregoing sending device, and the computer software instruction includes a program designed for executing the foregoing aspect by the sending device.

An eighth aspect of this application provides a storage medium, configured to store a computer software instruction used by the foregoing receiving device, and the computer software instruction includes a program designed for executing the foregoing aspect by the receiving device.

In this application, names of the sending device and the receiving device impose no limitation on the devices, and in actual implementation, these devices may appear with other names. The functions of each device fall within the scope of protection defined by the following claims and their equivalent technologies, provided that the functions are similar to those of the devices in this application.

These aspects or other aspects of the present disclosure are more concise and comprehensible in the description of the following embodiments.

DESCRIPTION OF EMBODIMENTS

Embodiments of this application provide a GEL codeword structure encoding and decoding method, an apparatus, and a related device, so as to reduce complexity of implementation, improve performance of a GEL code, and improve decoding efficiency.

Forward error correction (FEC) is a method for improving reliability of data communication, and has a function of correcting data. In a unidirectional communication channel, once an error is found, a receiving device no longer has a permission to request transmission. Therefore, when an error occurs during transmission, the receiving device can correct erroneous data by using FEC. In FEC, a GEL codeword structure is a commonly used encoding structure and decoding structure. The GEL codeword structure includes a row code and a column code, and a check code of a GEL code is obtained by performing an encoding operation on a parity bit of the column code by using the row code, thereby completing encoding of data. Before sending data, a sending device encodes data by using the GEL codeword structure. After receiving data, the receiving device decodes the data by using the GEL codeword structure, and corrects erroneous data. Before data is exchanged between the sending device and the receiving device, the sending device and the receiving device first agree on a GEL codeword structure encoding manner, or before receiving data sent by the sending device, the receiving device first obtains a GEL codeword structure encoding manner of the sending device.

Figure 1:
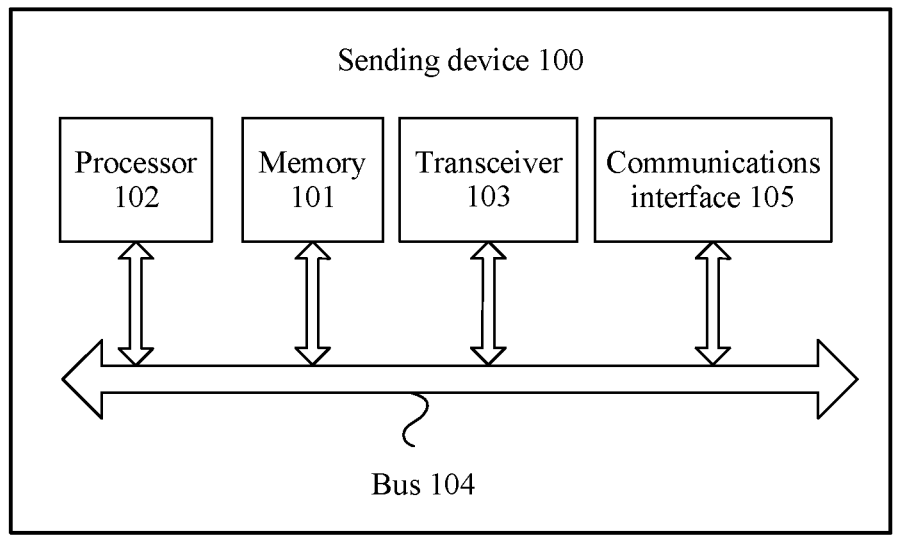
FIG. 1 is a schematic diagram of a sending device according to an embodiment of this application.

FIG. 1 is a sending device 100 provided in an embodiment of this application. The sending device 100 includes a memory 101, a processor 102, and a transceiver 103. The memory 101, the processor 102, and the transceiver 103 are interconnected by using a bus 104, and the sending device 100 may further include a communications interface 105.

The processor 102, the memory 101, the transceiver 103, and the communications interface 105 may implement mutual communication connections by using the bus 104, or may implement communication by using other means such as wireless transmission.

The memory 101 may include a volatile memory, for example, a random access memory (RAM); or the memory may include a nonvolatile memory, for example, a read-only memory (ROM), a flash memory, a hard disk (HDD), or a solid-state drive (SSD); or the memory 101 may include a combination of the memories of the foregoing types. When the technical solution provided in this application is implemented by using software, steps that need to be executed in the GEL codeword structure encoding method provided in FIG. 2 of this application are implemented. A computer instruction is stored in the memory 101 and is executed by the processor 102, and receiving and sending functions of the sending device 100 are implemented by the processor 102 by invoking the computer instruction in the memory 101 to control the transceiver 103.

Figure 2:
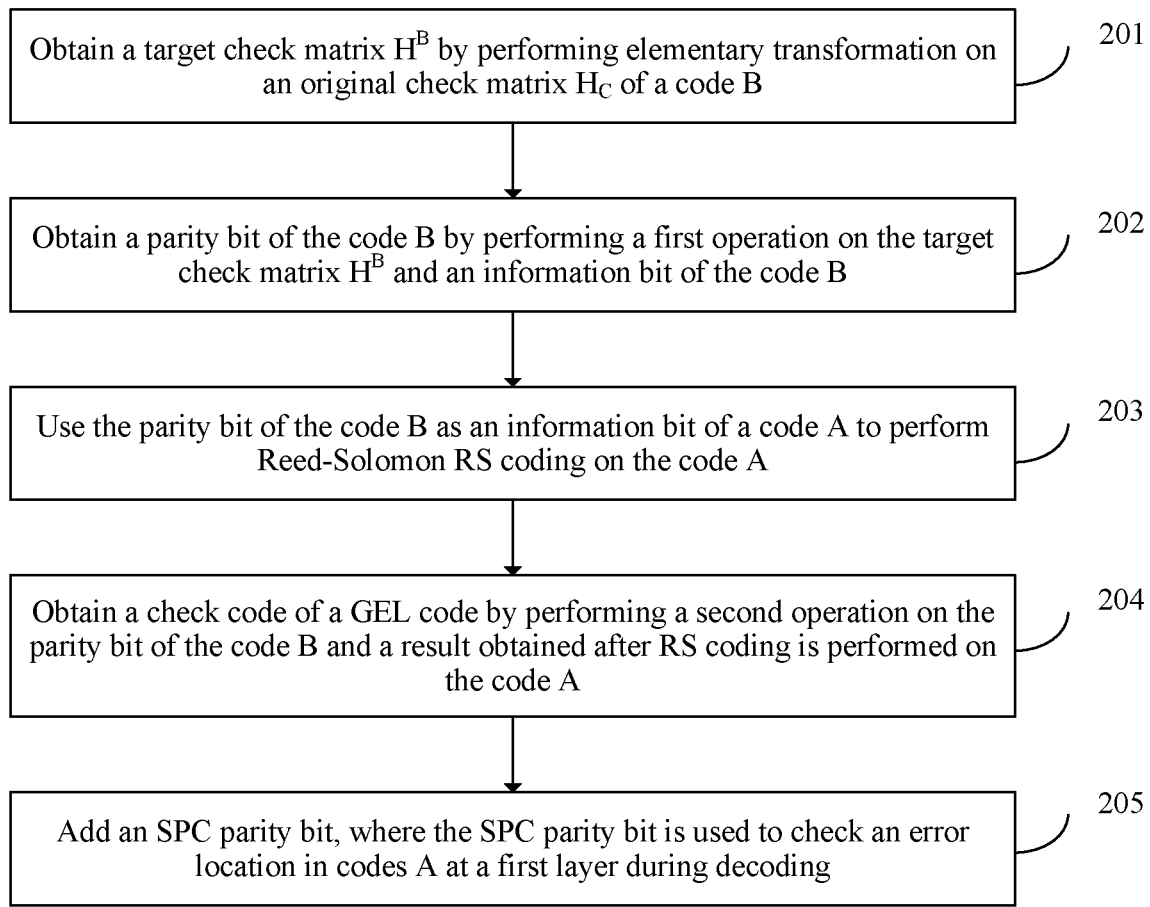
FIG. 2 is a schematic diagram of a GEL codeword structure encoding method according to an embodiment of this application.

This application further provides a GEL codeword structure encoding method. In FIG. 1, the sending device 100 executes the method during running. The method is applied to a sending device, and a schematic flowchart of the method is shown in FIG. 2.

201. Obtain a target check matrix $H^B$ by performing elementary transformation on an original check matrix $H_C$ of a code B.

In this embodiment of this application, the code B is a column code. First, elementary transformation needs to be performed on the original check matrix $H_C$ of the code B to obtain the target check matrix $H^B$, so as to subsequently obtain parity bits of codes B according to layers.

A matrix expression of the $H_C$ is:

$$\begin{pmatrix} \cdots & \cdots & \cdots & \cdots & \cdots \\ 1 & \alpha^5 & \alpha^{10} & \cdots & \alpha^{5(n_B-1)} \\ 1 & \alpha^3 & \alpha^6 & \cdots & \alpha^{3(n_B-1)} \\ 1 & \alpha & \alpha^2 & \cdots & \alpha^{n_B-1} \end{pmatrix}_{n_B \times n_B},$$

where $\alpha$ is a primitive element in a GF (2^12) field.

A matrix expression of the $H^B$ is: $H^B = G \times H_C$, where G is a row-elementary transformation matrix of $n_B \times n_B$.

202. Obtain a parity bit of the code B by performing a first operation on the target check matrix $H^B$ and an information bit of the code B.

Optionally, a formula for the first operation is:

$$H^B_l \times R_j, j \in \{1, \ldots, k_A^l\}, \text{ where}$$

$H^B_l$ represents an encoding matrix that is of a code B and that is at an $l^{th}$ layer of a GEL codeword structure, $R_j$ represents an information bit of the code B, and $K_A^l$ represents an information bit that is of a code A and that is at the $l^{th}$ layer.

203. Use the parity bit of the code B as an information bit of a code A to perform Reed-Solomon RS coding on the code A.

In the GEL codeword structure, the code A (which is a row code in this embodiment of this application) and the code B (a column code) are alternately encoded and alternately decoded. Therefore, the parity bit of the code B that is obtained through calculation is used as the information bit of the code A to perform RS coding on the code A.

Optionally, a formula for RS coding is:

$$r(x) = k(x) \bmod g(x), r(x) = r_0 x^0 + \ldots + r_{n_A - k_A - 1} x^{n_A - k_A - 1},$$
where r (x) represents a parity bit of the code A, k (x) represents the information bit of the code A, and g (x) represents a generator polynomial of RS coding.

204. Obtain a check code of a GEL code by performing a second operation on the parity bit of the code B and a result obtained after RS coding is performed on the code A.

Optionally, a formula for the second operation is:

$$\text{Parity}_l = \{r_0 + H^B_l \times R_{k_A-1}, \ldots, r_{n_A-k_A-1} + H^B_l \times R_{k_A-1}\},$$
where $\text{Parity}_l$ represents a check code that is of a GEL code and that is at the $l^{th}$ layer.

205. Add a Single bit Parity Check (SPC) parity bit, where the SPC parity bit is used to check an error location in codes A at a first layer during decoding.

To improve efficiency of decoding a code A at the first layer, the SPC parity bit is added to the entire GEL codeword structure, and is used by a receiving device to first check the error location in the codes A at the first layer according to the SPC parity bit in a decoding process.

It should be noted that the code A is defined in a finite field GF ($2^{l_1}$), the code B is defined in a finite field GF ($2^{l_2}$), and $l_1$ and $l_2$ are positive integers. In this way, an exact division constraint does not exist between $l_1$ and $l_2$, and values of $l_1$ and $l_2$ may be approximate or equal, so that a finite field of the code A and a finite field of the code B may be approximate or equal, thereby reducing complexity of implementation, and effectively improving performance of the GEL code. This meets requirements of the system for low power consumption of products, and also improves performance of a communications transmission system.

Optionally, a subcode constraint of the code A and a subcode constraint of the code B include:

$[n_A, k_{A_i}, d_{A_i}]_{q_A}$ and $[n_B, k_{B_i}, d_{B_i}]_{q_B}$ $r_{A_i} = n_A - k_{A_i}$ and $r_{B_i} = n_B - k_{B_i}$ $d_{A_1} \geq d_{A_2} \geq \ldots \geq d_{A_m}$ $d_{B_1} \leq d_{B_2} \leq \ldots \leq d_{B_m}$ $B_1 \subset B_2 \subset \ldots \subset B_m$, where $n_A$ represents a code length of a code A, $n_B$ represents a code length of a code B, $k_{Ai}$ represents an information bit of a code A in an $i^{th}$ row, $k_{Bi}$ represents an information bit of a code B in the $i^{th}$ row, $d_{Ai}$ represents a minimum code distance between codes A in the $i^{th}$ row, $r_{Ai}$ represents a length of a parity bit of a code A in the $i^{th}$ row, and $r_{Bi}$ represents a length of a parity bit of a code B in the $i^{th}$ row. An information bit of a code A and an information bit of a code B at each layer are designed in advance, and a minimum code distance between codes A and a minimum code distance between codes B at each layer are also designed in advance. In addition, a minimum code distance between codes A at the first layer is greater than or equal to a minimum code distance between codes A at a second layer, the minimum code distance between the codes A at the second layer is greater than or equal to a minimum code distance between codes A at a third layer, and so on. A minimum code distance between codes B at the first layer is less than or equal to a minimum code distance between codes B at the second layer, the minimum code distance between the codes B at the second layer is less than or equal to a minimum code distance between codes B at the third layer, and so on. As a result, after entire GEL coding is completed, check capabilities of all layers in the GEL codeword structure are equivalent. There is a subordinate relationship between all layers of codes B. The first layer belongs to the second layer, the second layer belongs to the third layer, and so on.

Figure 3:
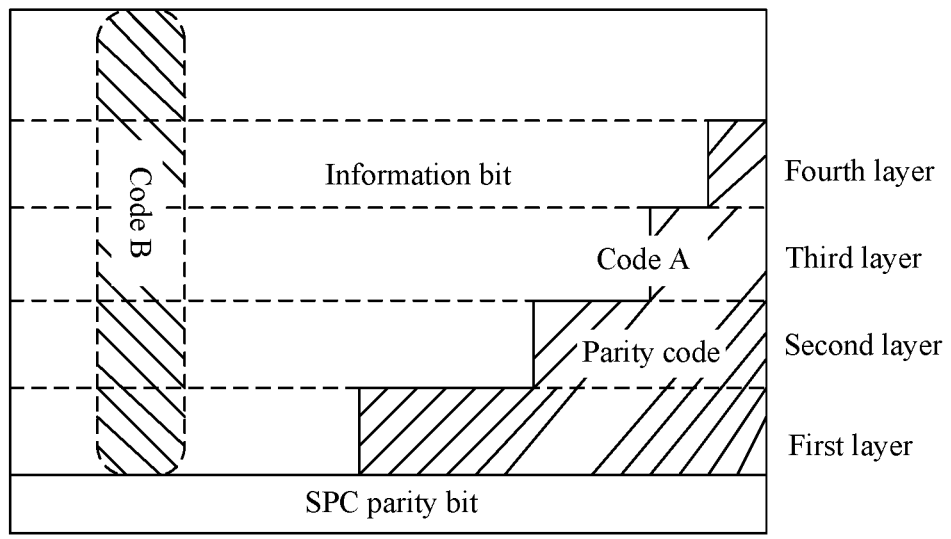
FIG. 3 is a schematic diagram of a GEL codeword structure according to an embodiment of this application.

FIG. 3 shows a GEL codeword structure obtained by using a GEL codeword structure encoding method described in an embodiment of this application. FIG. 3 is a 4-layer GEL codeword structure. The GEL codeword structure encoding method described in this embodiment of this application is not limited to being used in the 4-layer GEL codeword structure, and is applicable to a GEL codeword structure with two or more layers. Each row represents a code A, each column represents a code B, the code B is in a matrix form, the code A includes an information bit and a parity bit, a parity bit obtained by performing an operation on the code B is used as an information bit of the code A, a parity bit that is of the code A and that is obtained by performing RS coding by using the information bit of the code A is added to a parity bit that is of the code B and that is obtained through calculation, to obtain a check code of GEL.

Figure 4:
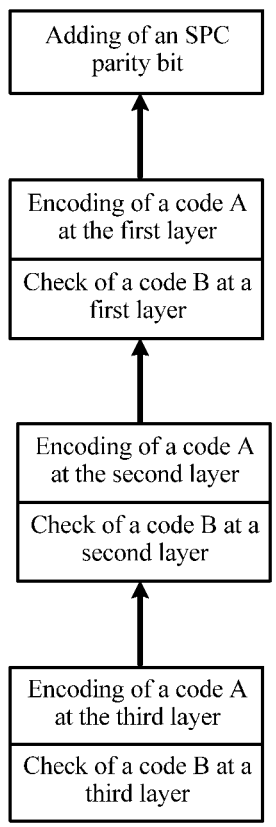
FIG. 4 is a schematic diagram of a GEL codeword structure encoding procedure according to an embodiment of this application.

As shown in FIG. 4, in an embodiment of this application, an encoding sequence in a GEL codeword structure encoding method is that encoding is started from a last layer, until an SPC parity bit is added. As shown in FIG. 4, a 3-layer GEL codeword structure is encoded. A third layer is first encoded, a second layer is then encoded, and finally a first layer is encoded. An encoding sequence of each layer is to first calculate a parity bit of a code B at a current layer, then check a check code of the code B, and finally encode a code A at the current layer.

Figure 5:
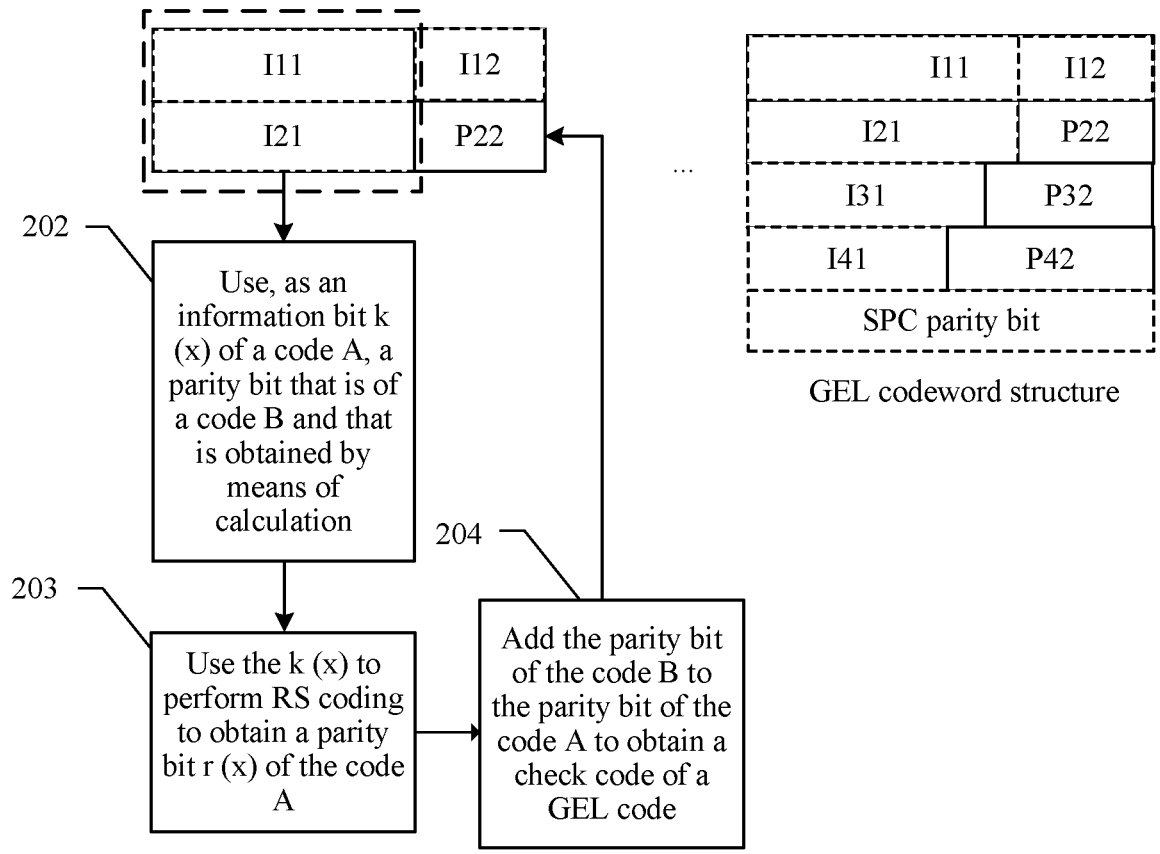
FIG. 5 is another schematic diagram of a GEL codeword structure encoding method according to an embodiment of this application.

FIG. 5 is a schematic diagram of both a procedure of the GEL codeword structure encoding method in FIG. 2 and the GEL codeword structure shown in FIG. 3. I represents an information bit, P represents a parity bit, I11 and I12 represent locations of information bits at the third layer, I21 represents a location of an information bit at the second layer, P21 represents a location of a parity bit at the second layer, and so on. k(x) represents an information bit of a code A, r (x) represents a parity bit of the code A, and a parity bit of a code B is obtained by using $H^B \times R$ described in the foregoing step 202.

Figure 6:
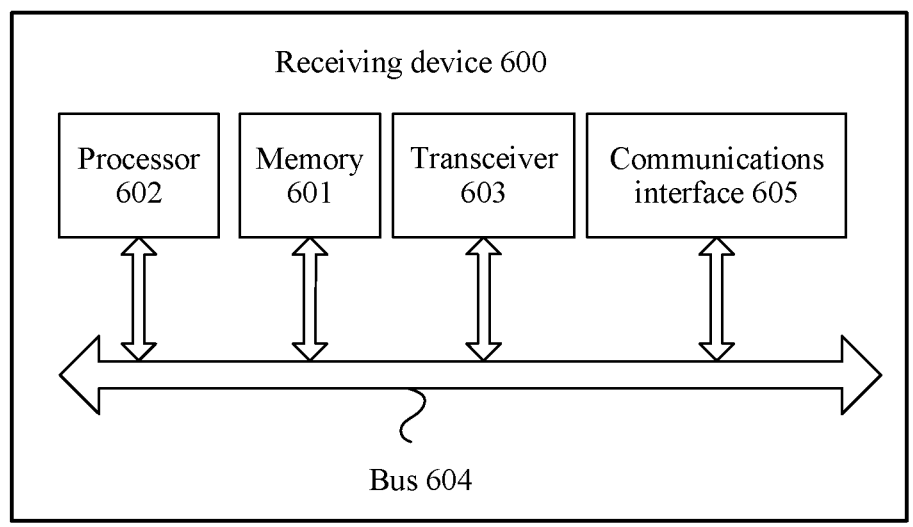
FIG. 6 is a schematic diagram of a receiving device according to an embodiment of this application.

FIG. 6 is a receiving device 600 provided in an embodiment of this application. The receiving device 600 includes a memory 601, a processor 602, and a transceiver 603. The memory 601, the processor 602, and the transceiver 603 are interconnected by using a bus 604, and the receiving device 600 may further include a communications interface 605.

The processor 602, the memory 601, the transceiver 603, and the communications interface 605 may implement mutual communication connections by using the bus 604, or may implement communication by using other means such as wireless transmission.

The memory 601 may include a volatile memory, for example, a random access memory; or the memory may include a nonvolatile memory, for example, a read-only memory, a flash memory, a hard disk, or a solid-state drive; or the memory 601 may include a combination of the memories of the foregoing types. When the technical solution provided in this application is implemented by using software, steps that need to be executed in the GEL codeword structure decoding method provided in FIG. 7 of this application are implemented. A computer instruction is stored in the memory 601 and is executed by the processor 602, and receiving and sending functions of the receiving device 600 are implemented by the processor 602 by invoking the computer instruction in the memory 601 to control the transceiver 603.

Figure 7:
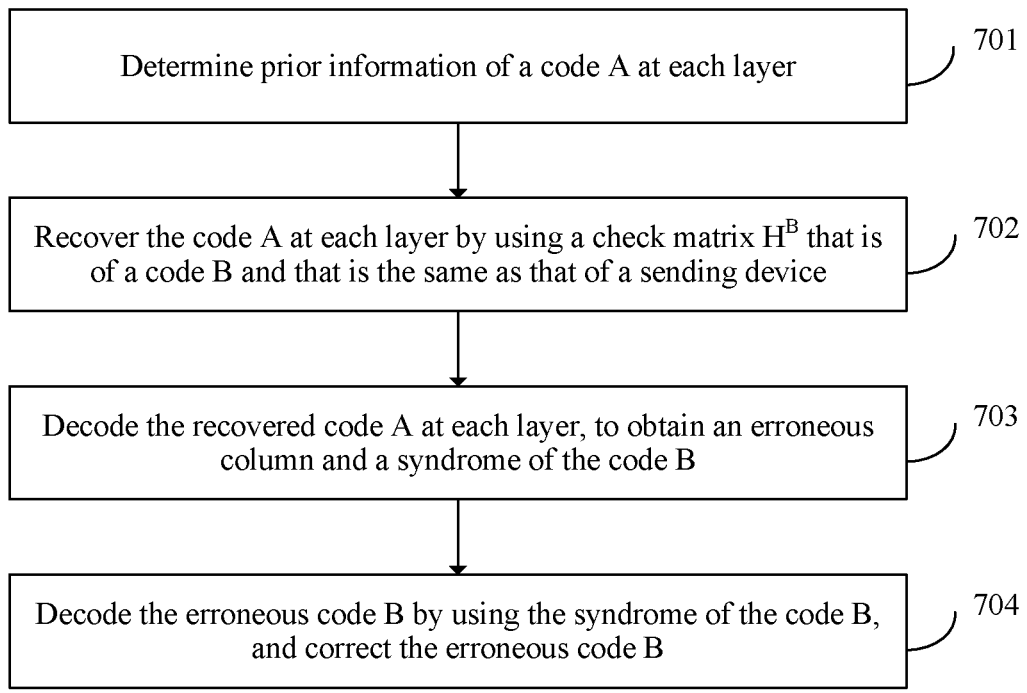
FIG. 7 is a schematic diagram of a GEL codeword structure decoding method according to an embodiment of this application.

This application further provides a GEL codeword structure decoding method. In FIG. 6, the receiving device 600 executes the method during running. The method is applied to a receiving device, and a schematic flowchart of the method is shown in FIG. 7.

701. Determine prior information of a code A at each layer, where the prior information of the code A at each layer is a location of an error occurring when a code B is decoded at an upper layer, prior information of a code A at a first layer is an SPC parity bit, and the SPC parity bit is a parity bit added when a sending device performs GEL coding.

In a GEL codeword structure of this application, when the sending device encodes data, the SPC parity bit is added to the GEL codeword structure, where the SPC parity bit is used as the prior information of the code A at the first layer during decoding. In a decoding process, decoding and error correction are started and performed at the first layer, and decoding and error correction are performed at all layers sequentially until decoding and error correction at a last layer are completed. Prior information needs to be obtained during decoding of each layer. The prior information is generally a location of an error occurring when a code B is decoded at an upper layer. However, there is no upper layer for the code A at the first layer. Therefore, in this embodiment of this application, the SPC parity bit is added to the GEL codeword structure during encoding, so that the SCP parity bit is used as the prior information of the code A at the first layer during decoding.

702. Recover the code A at each layer by using a check matrix $H^B$ that is of the code B and that is the same as that of the sending device.

703. Decode the recovered code A at each layer, to obtain an erroneous column and a syndrome of the code B.

After the code A at each layer is recovered according to the check matrix $H^B$, the code A with the prior information is decoded, and an error value obtained by decoding the code A is the syndrome of the code B. Finally, an original syndrome of the code B is obtained through calculation by using the syndrome of the code B and a transformation matrix G A function of the original syndrome of the code B is to provide corresponding error status information for decoding of the code B. The original syndrome is used for the code B to calculate an error location. A relationship among the original check matrix $H_C$ of the code B, the target check matrix $H^B$, and the transformation matrix G is $H_C=G\times H^B$.

704. Decode the erroneous code B by using the syndrome of the code B, and correct the erroneous code B.

The code A is a row code, the code B is a column code, the code A is defined in a finite field GF ($2^{l_1}$), the code B is defined in a finite field GF ($2^{l_2}$), and $l_1$ and $l_2$ are positive integers.

Optionally, when an error occurs when a code B is decoded at an upper layer, in a process of decoding a code B at a current layer, rollback is first performed to correct the code B at the upper layer, and then the code B at the current layer is decoded.

For example, a decoding process is specifically described below.

Figure 8:
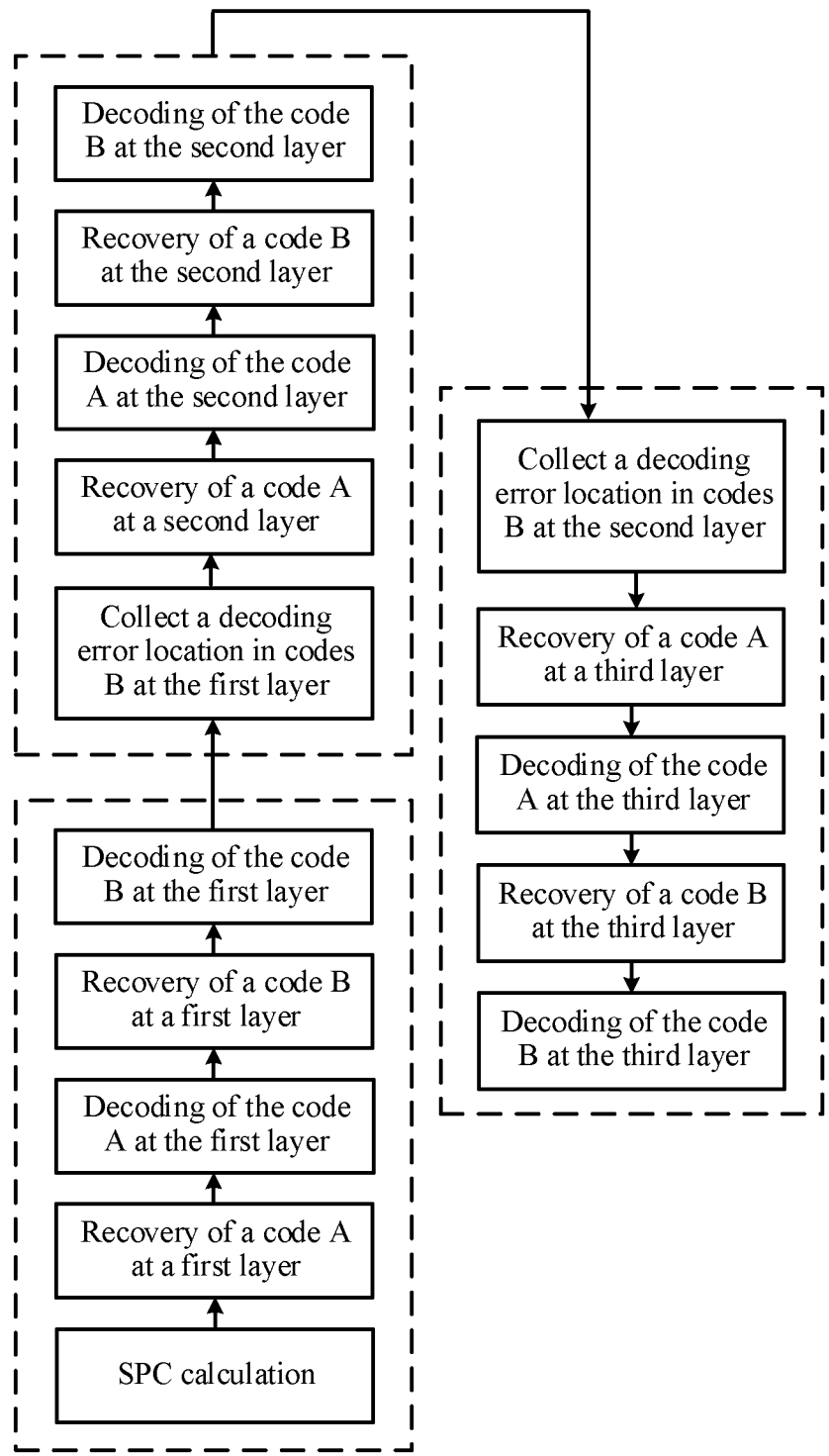
FIG. 8 is a schematic diagram of a GEL codeword structure decoding procedure according to an embodiment of this application.

FIG. 8 is a schematic diagram of decoding by using an example in which a GEL codeword structure is a 3-layer codeword structure, and a specific decoding manner is as follows:

A decoding process at a first layer is as follows:

Step 1: Calculate an SPC parity bit (used as prior information of a code A) and recover a code A at the first layer.

Step 2: Decode the code A at the first layer, so as to obtain a location (a column location) of an erroneous code B and a corresponding syndrome of the code B at the first layer.

Step 3: Decode the erroneous code B by using the syndrome of the code B at the first layer, and correct the erroneous code B.

A decoding process at a second layer is as follows:

Step 1: Collect a decoding error location (used as prior information of a code A at the second layer) in codes B at the first layer, and recover the code A at the second layer.

Step 2: Decode the code A at the second layer, so as to obtain a location of an erroneous code B and a corresponding syndrome of the code B at the second layer.

Step 3: When an error occurs when a code B at the first layer is decoded, first roll back to correct the code B at the first layer, then decode the erroneous code B by using the syndrome of the code B at the second layer, and correct the erroneous code B.

A decoding process at an $m^{th}$ layer is as follows:

Step 1: Collect a decoding error location (used as prior information of a code A at the $m^{th}$ layer) of a code Bm−1 (i.e., in codes B at the $(m-1)^{th}$ layer), and recover the code A at the $m^{th}$ layer.

Step 2: Decode the code A at the $m^{th}$ layer, so as to obtain a location of an erroneous code B and a corresponding syndrome of the code B at the $m^{th}$ layer.

Step 3: When an error occurs when a code B at the $(m-1)^{th}$ layer is decoded, first roll back to correct the code B at the $(m-1)^{th}$ layer, then decode the erroneous code B by using the syndrome of the code B at the $m^{th}$ layer, and correct the erroneous code B.

After GEL decoding at all layers is completed, the entire decoding process ends.

This application further provides a sending device 900, and the device may be implemented by using the sending device 100 shown in FIG. 1, or may be implemented by using an application-specific integrated circuit (ASIC) or a programmable logic device (PLD). The PLD may be a complex programmable logic device, CPLD), a field programmable gate array (FPGA), generic array logic (GAL), or any combination thereof. The sending device 900 is configured to implement the method executed by the sending device shown in FIG. 2. When the method executed by the sending device shown in FIG. 2 is implemented by using software, the sending device 900 may be alternatively a software module.

Figure 9:
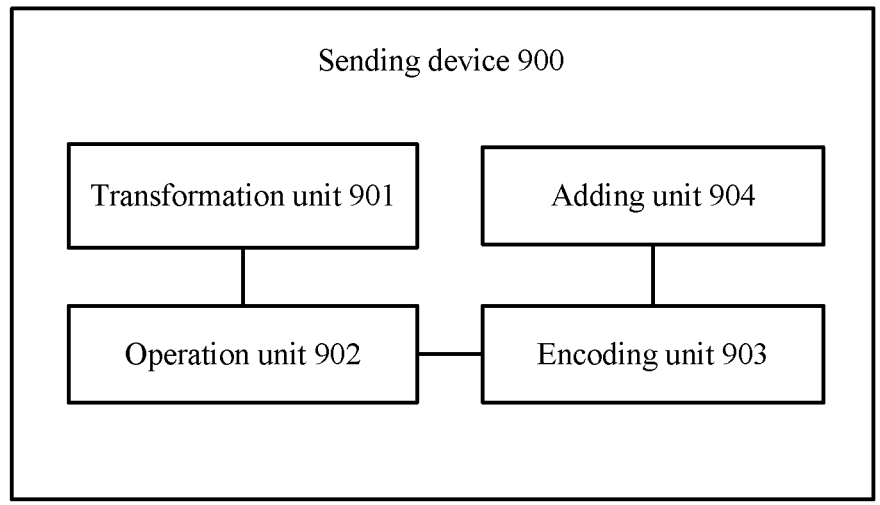
FIG. 9 is another schematic diagram of a sending device according to an embodiment of this application.

FIG. 9 is a schematic structural composition diagram of the sending device 900, and the sending device 900 includes a transformation unit 901, an operation unit 902, an encoding unit 903, and an adding unit 904. During working, the method executed by the sending device in the GEL codeword structure encoding method shown in FIG. 2 is executed.

This application further provides a receiving device 1000, and the device may be implemented by using the receiving device 600 shown in FIG. 6, or may be implemented by using an ASIC or a PLD. The PLD may be a CPLD, an FPGA, GAL, or any combination thereof. The receiving device 1000 is configured to implement the method executed by the receiving device shown in FIG. 7. When the method executed by the receiving device shown in FIG. 2 is implemented by using software, the receiving device 1000 may be alternatively a software module.

Figure 10:
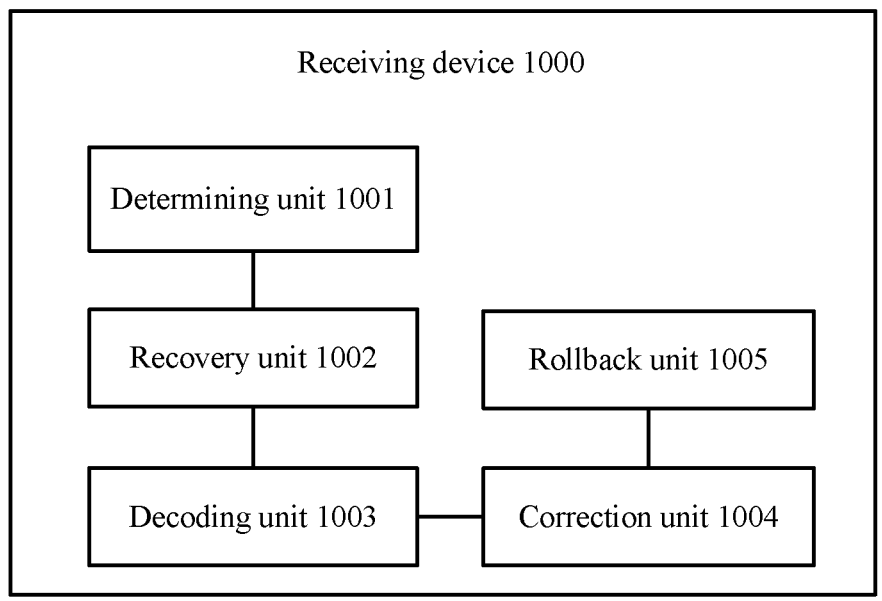
FIG. 10 is another schematic diagram of a receiving device according to an embodiment of this application.

FIG. 10 is a schematic structural composition diagram of the receiving device 1000, and the receiving device 1000 includes a determining unit 1001, a recovery unit 1002, a decoding unit 1003, a correction unit 1004, and a rollback unit 1005. During working, the method executed by the receiving device in the GEL codeword structure decoding method shown in FIG. 7 is executed.

An embodiment of this application further provides a computer storage medium. The computer storage medium may store a program. When being executed, the program includes all or some of the steps of the GEL codeword structure encoding and decoding method described in the foregoing method embodiments.

It may be clearly understood by persons skilled in the art that, for ease and brevity of description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A generalized error-locating (GEL) codeword structure encoding method in a communication network, comprising:
   determining, by a processor of a sending device, a target check matrix $H^B$ by performing elementary transformation on an original check matrix $H_C$ of a code B;
   determining, by the sending device, a parity bit of the code B by performing a first operation on the target check matrix $H^B$ and an information bit of the code B;
   determining, by the sending device, to use the parity bit of the code B as an information bit of a code A to perform Reed-Solomon (RS) coding on the code A;
   determining, by the sending device, a check code of a GEL code by performing a second operation on the parity bit of the code B and a result determined after RS coding is performed on the code A; and
   adding, by the sending device, a single bit parity check (SPC) parity bit to the GEL code, wherein the SPC parity bit is used to check an error location in the code A at a first layer during a decoding process to increase a success rate of decoding the code A to improve an efficiency of the decoding process for communications, wherein the code A is a row code, the code B is a column code, the code A is defined in a finite field Galois field (GF) ($2^{l_1}$), the code B is defined in a finite field GF ($2^{l_2}$), and $l_1$ and $l_2$ are positive integers, such that an exact division constraint does not exist between $l_1$ and $l_2$ to reduce a complexity of decoding the code B to improve a performance of the GEL code for communications; and
   transmitting, by the sending device, data encoded with the GEL code to a receiving device over the communication network.

2. The method according to claim 1, wherein a formula for determining the parity bit of the code B by performing the first operation on the target check matrix $H^B$ and the information bit of the code B comprises:

$$H_l^B \times R_j, j \in \{1, \ldots, k_A^l\}, \text{ where}$$

$H_l^B$ represents a target check matrix $H^B$ that is of a code B and that is at an $l^{th}$ layer of a GEL codeword structure, $R_j$ represents an information bit of the code B, and $K_A^l$ represents an information bit that is of a code A and that is at the $l^{th}$ layer.

3. The method according to claim 1, wherein a formula to use the parity bit of the code B as the information bit of the code A to perform Reed-Solomon (RS) coding on the code A comprises:

$$r(x) = k(x) \bmod g(x) \text{ and } r(x) = r_0 x^0 + \ldots + r_{n_A - k_A - 1} x^{n_A - k_A - 1}, \text{ wherein}$$

r (x) represents a parity bit of the code A, k (x) represents the information bit of the code A, and g (x) represents a generator polynomial of RS coding.

4. The method according to claim 1, wherein determining a check code of a GEL code by performing a second operation on the parity bit of the code B and a result determined after RS coding is performed on the code A comprises:

$$\text{Parity}_l = \{r_0 + H_l^B \times R_{k_A - 1}, \ldots, r_{n_A - k_A - 1} + H_l^B \times R_{k_A - 1}\}, \text{ wherein}$$

Parity$_l$ represents a check code that is of a GEL code and that is at the $l^{th}$ layer.

5. The method according to claim 1, wherein a subcode constraint of the code A and a subcode constraint of the code B comprise:

$$[n_A, k_{A_i}, d_{A_i}]_{q_A} \text{ and } [n_B, k_{B_i}, d_{B_i}]_{q_B}$$

$$r_{A_i} = n_A - k_{A_i} \text{ and } r_{B_i} = n_B - k_{B_i}$$

$$d_{A_1} \geq d_{A_2} \geq \ldots \geq d_{A_m}$$

$$d_{B_1} \leq d_{B_2} \leq \ldots \leq d_{B_m}$$

$$B_1 \subset B_2 \subset \ldots \subset B_m, \text{ wherein}$$

$n_A$ represents a code length of a code A, $n_B$ represents a code length of a code B, $k_{Ai}$ represents an information bit of a code A in an $i^{th}$ row, $k_{Bi}$ represents an information bit of a code B in the $i^{th}$ row, $d_{Ai}$ represents a minimum code distance between codes A in the $i^{th}$ row, $r_{Ai}$ represents a length of a parity bit of a code A in the $i^{th}$ row, and $r_{Bi}$ represents a length of a parity bit of a code B in the $i^{th}$ row.

6. A generalized error-locating (GEL) codeword structure decoding method in a communication network, comprising:
receiving, by a receiving device, data encoded with a GEL code from a sending device over the communication network;
determining, by a processor of the receiving device, prior information of a code A at each layer, wherein the prior information of the code A at each layer is a location of an error occurring when a code B is decoded at an upper layer, prior information of a code A at a first layer is a single bit parity check (SPC) parity bit added when a sending device performs GEL coding to encode the data with the GEL code, wherein the SPC parity bit is used to check an error location in the code A at the first layer during a decoding process to increase a success rate of decoding the code A to improve an efficiency of the decoding process for communications;
recovering the code A at each layer by using a check matrix $H^B$ that is of the code B and that is the same as that of the sending device;
decoding the recovered code A at each layer, to determine an erroneous code B and a syndrome of the code B; and
decoding the erroneous code B by using the syndrome of the code B, and correcting the erroneous code B,
wherein the code A is a row code, the code B is a column code, the code A is defined in a finite field Galois field (GF) $(2^{l_1})$, the code B is defined in a finite field GF $(2^{l_2})$, and $l_1$ and $l_2$ are positive integers, such that an exact division constraint does not exist between $l_1$ and $l_2$ to reduce a complexity of decoding the code B to improve a performance of the GEL code for communications.

7. The method according to claim 6, further comprising:
when an error occurs when the code B is decoded at the upper layer, in a process of decoding a code B at a current layer, first rolling back to correct the code B at the upper layer.

8. A sending device, comprising:
a memory and a processor, wherein the memory and the processor are interconnected, the memory stores computer instructions which, when executed by the processor, cause the sending device to:
determine a target check matrix $H^B$ by performing elementary transformation on an original check matrix $H_C$ of a code B,
determine a parity bit of the code B by performing a first operation on the target check matrix $H^B$ and an information bit of the code B,
determine to use the parity bit of the code B as an information bit of a code A to perform Reed-Solomon (RS) coding on the code A;
determine a check code of a generalized error-locating (GEL) code by performing a second operation on the parity bit of the code B and a result determined after RS coding is performed on the code A; and
add a single bit parity check (SPC) parity bit to the GEL code, wherein the SPC parity bit is used to check an error location in the code A at a first layer during a decoding process to increase a success rate of decoding the code A to improve an efficiency of the decoding process for communications,
wherein the code A is a row code, the code B is a column code, the code A is defined in a finite field Galois field (GF) $(2^{l_1})$, the code B is defined in a finite field GF $(2^{l_2})$, and $l_1$ and $l_2$ are positive integers, such that an exact division constraint does not exist between $l_1$ and $l_2$ to reduce a complexity of decoding the code B to improve a performance of the GEL code for communications; and
transmit data encoded with the GEL code to a receiving device over the communication network.

9. The sending device according to claim 8, wherein a formula to determine the parity bit of the code B by performing the first operation on the target check matrix $H^B$ and the information bit of the code B comprises:

$$H_l^B \times R_j, j \in \{1, \ldots, k_A^l\|\}, \text{ where}$$

$H_l^B$ represents a target check matrix $H^B$ that is of a code B and that is at an $l^{th}$ layer of a GEL codeword structure, $R_j$ represents an information bit of the code B, and $K_A^l$ represents an information bit that is of a code A and that is at the $l^{th}$ layer.

10. The sending device according to claim 9, wherein a formula to use the parity bit of the code B as the information bit of the code A to perform Reed-Solomon (RS) coding on the code A comprises:

$$r(x) = k(x) \bmod g(x), r(x) = r_0 x^0 + \ldots + r_{n_A - k_A - 1} x^{n_A - k_A - 1},$$
wherein r (x) represents a parity bit of the code A, k (x) represents the information bit of the code A, and g (x) represents a generator polynomial of RS coding.

11. The sending device according to claim 9, wherein to determine the check code of the GEL code by performing the second operation on the parity bit of the code B and the result determined after RS coding is performed on the code A, the computer instructions, when executed by the processor, cause the sending device to use the following:

$$\text{Parity}_l = \{r_0 + H_l^B \times R_{k_A - 1}, \ldots, r_{n_A - k_A - 1} + H_l^B \times R_{k_A - 1}\},$$
wherein Parity$_l$ represents a check code that is of a GEL code and that is at the $l^{th}$ layer.

12. The sending device according to claim 8, wherein a formula to use the parity bit of the code B as the information bit of the code A to perform Reed-Solomon (RS) coding on the code A comprises:

$$r(x) = k(x) \bmod g(x), r(x) = r_0 x^0 + \ldots + r_{n_A - k_A - 1} x^{n_A - k_A - 1},$$
wherein r (x) represents a parity bit of the code A, k (x) represents the information bit of the code A, and g (x) represents a generator polynomial of RS coding.

13. The sending device according to claim 12, wherein to determine the check code of the GEL code by performing the second operation on the parity bit of the code B and the result determined after RS coding is performed on the code A, the computer instructions, when executed by the processor, cause the sending device to use the following:

$$\text{Parity}_l = \{r_0 + H_l^B \times R_{k_A - 1}, \ldots, r_{n_A - k_A - 1} + H_l^B \times R_{k_A - 1}\},$$
wherein Parity$_l$ represents a check code that is of a GEL code and that is at the $l^{th}$ layer.

14. The sending device according to claim 8, wherein to determine the check code of the GEL code by performing the second operation on the parity bit of the code B and the result determined after RS coding is performed on the code A, the computer instructions, when executed by the processor, cause the sending device to use the following:

$$\text{Parity}_l = \{r_0 + H_l^B \times R_{k_A - 1}, \ldots, r_{n_A - k_A - 1} + H_l^B \times R_{k_A - 1}\},$$
wherein Parity$_l$ represents a check code that is of a GEL code and that is at the $l^{th}$ layer.

15. The sending device according to claim 8, wherein a subcode constraint of the code A and a subcode constraint of the code B comprise:

$[n_A, k_{A_i}, d_{A_i}]_{q_A}$ and $[n_B, k_{B_i}, d_{B_i}]_{q_B}$ $r_{A_i} = n_A - k_{A_i}$ and $r_{B_i} = n_B - k_{B_i}$ $d_{A_1} \geq d_{A_2} \geq \ldots \geq d_{A_m}$ $d_{B_1} \leq d_{B_2} \leq \ldots \leq d_{B_m}$ $B_1 \subset B_2 \subset \ldots \subset B_m$, where $n_A$ represents a code length of a code A, $n_B$ represents a code length of a code B, $k_{Ai}$ represents an information bit of a code A in an $i^{th}$ row, $k_{Bi}$ represents an information bit of a code B in the $i^{th}$ row, $d_{Ai}$ represents a minimum code distance between codes A in the $i^{th}$ row, $r_{Ai}$ represents a length of a parity bit of a code A in the $i^{th}$ row, and $r_{Bi}$ represents a length of a parity bit of a code B in the $i^{th}$ row.

16. A receiving device, comprising:
a memory and a processor, wherein the memory and the processor are interconnected, the memory stores computer instructions which, when executed by the processor, cause the receiving device to:
receive data encoded with a GEL code from a sending device over the communication network;
determine prior information of a code A at each layer, wherein the prior information of the code A at each layer is a location of an error occurring when a code B is decoded at an upper layer, prior information of a code A at a first layer is a single bit parity check (SPC) parity bit added when a sending device performs generalized error-locating (GEL) coding to encode the data with the GEL code, wherein the SPC parity bit is used to check an error location in the code A at the first layer during a decoding process to increase a success rate of decoding the code A to improve an efficiency of the decoding process for communications,
recover the code A at each layer by using a check matrix $H^B$ that is of the code B and that is the same as that of the sending device,
decode the recovered code A at each layer, to determine an erroneous code B and a syndrome of the code B, and
decode the erroneous code B by using the syndrome of the code B, and correct the erroneous code B,
wherein the code A is a row code, the code B is a column code, the code A is defined in a finite field Galois field (GF) ($2^{l_1}$), the code B is defined in a finite field GF ($2^{l_2}$), and $l_1$ and $l_2$ are positive integers, such that an exact division constraint does not exist between $l_1$ and $l_2$ to reduce a complexity of decoding the code B to improve a performance of the GEL code for communications.

17. The receiving device according to claim 16, wherein the computer instructions, when executed by the processor, further cause the receiving device to:
when an error occurs when the code B is decoded at the upper layer, in a process of decoding a code B at a current layer, first roll back to correct the code B at the upper layer.

* * * * *